United States Patent
Sata et al.

(10) Patent No.: US 8,502,434 B2
(45) Date of Patent: Aug. 6, 2013

(54) MULTI-LAYER PIEZOELECTRIC ELEMENT, METHOD FOR MANUFACTURING THE SAME, INJECTION APPARATUS AND FUEL INJECTION SYSTEM

(75) Inventors: Tetsuro Sata, Kirishima (JP); Masahiro Sato, Kirishima (JP)

(73) Assignee: Kyocera Corporation, Kyoto (JP)

( * ) Notice: Subject to any disclaimer, the term of this patent is extended or adjusted under 35 U.S.C. 154(b) by 524 days.

(21) Appl. No.: 12/744,897

(22) PCT Filed: Nov. 27, 2008

(86) PCT No.: PCT/JP2008/071535
§ 371 (c)(1),
(2), (4) Date: Sep. 10, 2010

(87) PCT Pub. No.: WO2009/069693
PCT Pub. Date: Jun. 4, 2009

(65) Prior Publication Data
US 2010/0320283 A1 Dec. 23, 2010

(30) Foreign Application Priority Data
Nov. 27, 2007 (JP) .................................. 2007-306226

(51) Int. Cl.
*H01L 41/083* (2006.01)
(52) U.S. Cl.
USPC ............................ 310/328; 310/366; 29/25.35
(58) Field of Classification Search
USPC .......................... 310/328, 366–368; 29/25.35
See application file for complete search history.

(56) References Cited

U.S. PATENT DOCUMENTS

| | | | |
|---|---|---|---|
| 6,930,435 B2 * | 8/2005 | Boecking | 310/317 |
| 2002/0152857 A1 | 10/2002 | Sato et al. | |
| 2005/0263133 A1 * | 12/2005 | Magel | 123/446 |
| 2006/0214541 A1 | 9/2006 | Tsuzuki et al. | |
| 2010/0156251 A1 * | 6/2010 | Hohmann et al. | 310/364 |
| 2011/0000466 A1 * | 1/2011 | Sato | 123/478 |

FOREIGN PATENT DOCUMENTS

| | | |
|---|---|---|
| JP | 63-122288 | 5/1988 |
| JP | 2001-094164 | 4/2001 |
| JP | 2004-336011 | 11/2004 |
| JP | 2006-303445 | * 11/2006 |
| WO | 9824296 A2 | 6/1998 |
| WO | WO/2007/118883 | * 10/2007 |

OTHER PUBLICATIONS

Extended European search report dated Mar. 25, 2013 issued in corresponding European application 08854506.6 cites the U.S. patent application publications and foreign patent document listed above.

* cited by examiner

*Primary Examiner* — Thomas Dougherty
(74) *Attorney, Agent, or Firm* — DLA Piper LLP (US)

(57) ABSTRACT

A multi-layer piezoelectric element that has high durability with capability to operable continuously under higher voltage and higher pressure over a long period of time, a method for manufacturing the same, an injection apparatus and a fuel injection system are provided. The multi-layer piezoelectric element, comprising: a multi-layer structure comprising a plurality of internal electrode layers and a plurality of piezoelectric material layers, the plurality of piezoelectric material layers being stacked with each one of the plurality of internal electrode layers intervened between each two of the plurality of piezoelectric material layers, wherein a cross-sectional area of a cross section of the multi-layer structure parallel to the plurality of internal electrode layers is smaller in both end portions in a stacked direction than in a middle portion in the stacked direction.

5 Claims, 4 Drawing Sheets

US 8,502,434 B2

MULTI-LAYER PIEZOELECTRIC ELEMENT, METHOD FOR MANUFACTURING THE SAME, INJECTION APPARATUS AND FUEL INJECTION SYSTEM

CROSS-REFERENCE TO THE RELATED APPLICATIONS

This application is a national stage of international application No. PCT/JP2008/071535, filed on Nov. 27, 2008 and claims the benefit of priority under 35 USC 119 to Japanese Patent Application No. 2007-306226, filed on Nov. 27, 2007, the entire contents of which are incorporated herein by reference.

TECHNICAL FIELD

The present invention relates to a multi-layer piezoelectric element, a method for manufacturing the same, an injection apparatus and a fuel injection system.

BACKGROUND ART

There has hitherto been known a multi-layer piezoelectric element (hereafter sometimes referred to simply as an element) that comprises a multi-layer structure formed by stacking a plurality of piezoelectric material layers via internal electrode layers and a pair of external electrodes formed on side face of the multi-layer structure. The element generally has an opposing portion where the internal electrode layers oppose each other and non-opposing portions positioned on sides of both ends of the opposing portion in the stacked direction. When a voltage is applied to the element, the opposing portion undergoes displacement and the non-opposing portions do not undergo displacement, and therefore stress tends to be generated in a region around the interface between these sections. Therefore, there is disclosed an element that is designed for the purpose of reducing the stress generated around the interface by setting the modulus of elasticity of the non-opposing portions to be less than the modulus of elasticity of the opposing portion (Patent Document 1).

Patent Document 1: Japanese Unexamined Patent Publication (Kokai) No. 2001-94164

DISCLOSURE OF THE INVENTION

Problems to be Solved by the Invention

However, there have recently been demands for further improvement in durability of the element that is required to be operable continuously under higher voltage and higher pressure over a long period of time.

Thus, an object of the present invention is to provide a multi-layer piezoelectric element that has high durability with capability to operable continuously under higher voltage and higher pressure over a long period of time, a method for manufacturing the same, an injection apparatus and a fuel injection system.

Means for Solving the Problems

The multi-layer piezoelectric element of the present invention comprises a multi-layer structure that has a plurality of internal electrode layers and a plurality of piezoelectric material layers that are stacked with each one of the plurality of internal electrode layers intervened between each two of the plurality of piezoelectric material layers, wherein a cross-sectional area of a cross section of the multi-layer structure parallel to the plurality of internal electrode layers is smaller in both end portions in a stacked direction than in a middle portion in the stacked direction.

Effects of the Invention

According to the multi-layer piezoelectric element of the present invention, it is possible to exert the effect capable of reducing the stress generated around the interface between the opposing portion and the non-opposing portions.

DESCRIPTION OF REFERENCE NUMERALS

Figure 1:
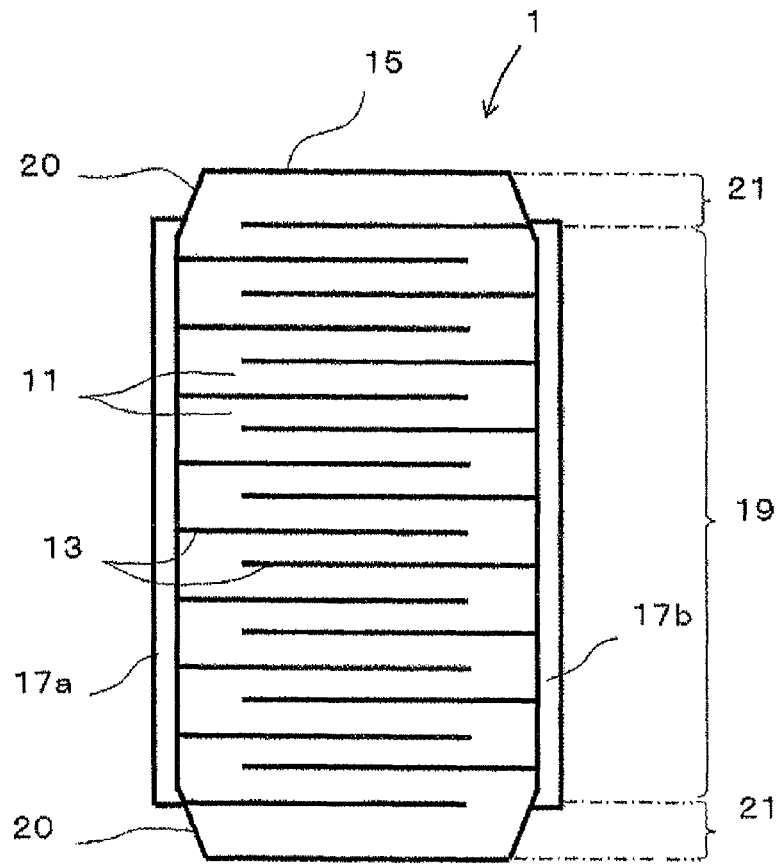
FIG. 1 is a side view showing a multi-layer piezoelectric element according to one embodiment of the present invention.

11: Piezoelectric material layer
13: Internal electrode layer
15: Multi-layer structure
17: External electrode
19: Opposing portion
21: Non-opposing portions
20: Sectional area reducing portion

BEST MODE FOR CARRYING OUT THE INVENTION

Multi-Layer Piezoelectric Element

Figure 2:
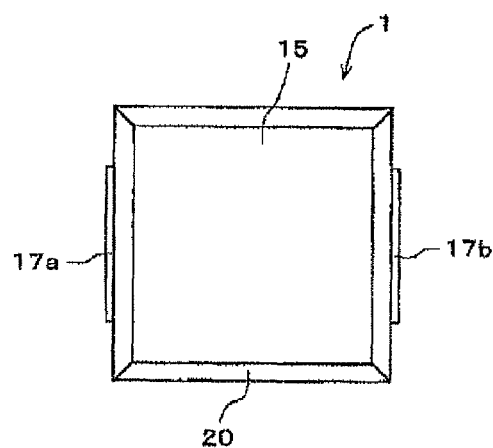
FIG. 2 is a plan view of the multi-layer piezoelectric element shown in FIG. 1.

The multi-layer piezoelectric element according to one embodiment of the present invention will be described in detail below with reference to the accompanying drawings. FIG. 1 is a side view of the multi-layer piezoelectric element according to this embodiment, and FIG. 2 is a plan view of the multi-layer piezoelectric element shown in FIG. 1. The multi-layer piezoelectric element 1 has a multi-layer structure 15 formed by stacking piezoelectric material layers 11 and internal electrode layers 13 alternately one on another. The multi-layer structure 15 has a pair of external electrodes 17 (an external electrode 17a of negative polarity and an external electrode 17b of positive polarity) formed on the side face thereof. The multi-layer structure 15 has an opposing portion 19 where the internal electrode layers 13 oppose each other and non-opposing portions 21 positioned on sides of both ends of the opposing portion 19 in the stacked direction.

The opposing portion 19 is a driving portion where each piezoelectric material layer 11 sandwiched between the internal electrode layers 13 undergoes expansion and contraction in response to the voltage applied between the internal electrode layers positioned on both sides thereof so as to change the dimension of the element in the stacked direction.

In contrast, the non-opposing portions 21 are non-driving portions that are not provided with the internal electrode layers 13 that sandwich the piezoelectric material layer 11 and are subjected to the voltage, and therefore does not undergo displacement.

Therefore, in this embodiment, the non-opposing portions 21 are formed in a configuration that can easily deform, so that the non-opposing portions 21 do not restrict the opposing portion 19 from expanding and contracting thereby to reduce the stress generated in the interface thereof with the opposing portion 19.

In this element, the area of a cross section of the multi-layer structure 15 parallel to the internal electrode layers 13 is smaller in both end potions in the stacked direction than in the middle portion in the stacked direction. This makes it possible to reduce the stress generated in the interface between the opposing portion and the non-opposing portions. This is because the force that restricts the deformation caused by the action of the opposing portion is decreased by making the area smaller in the cross sections located at both ends that are nearer to the non-opposing portions that do not undergo displacement when subjected to voltage, than in the conventional constitution.

In this description, the cross section refers to a section of the multi-layer structure 15 parallel to the internal electrode layers 13.

In this embodiment, the non-opposing portions 21 have a sectional area reducing portion 20 where the cross-sectional area becomes smaller toward both ends in the stacked direction as a more preferable aspect. Gradually reducing the cross-sectional area in the non-opposing portions 21 in this way enables it to suppress stress from concentrating in a part of the multi-layer structure 15 since no significant step is formed in the multi-layer structure 15 having such a configuration.

In the aspect shown in FIG. 1, the sectional area reducing portion 20 is formed where the cross-sectional area gradually decreases from the interface between the opposing portion 19 and the non-opposing portions 21, while the cross sectional area remains substantially constant in the opposing portion 19 (area of the cross section parallel to the internal electrode layers 13). However, the sectional area reducing portion 20 may also be formed so as to extend across the opposing portion 19 and the non-opposing portions 21. According to the present invention, it suffices that the area of a cross section of the multi-layer structure 15 parallel to the internal electrode layers 13 is smaller in the non-opposing portions 21 positioned at both end portions in the stacked direction than in the middle portion in the stacked direction (center of the opposing portion).

The method for manufacturing an element of this embodiment will be described below. The method of this embodiment comprises a step of polishing the side faces of the multi-layer structure 15 to be described hereinafter, so that the area of the cross section of the multi-layer structure 15 parallel to the internal electrode layers 13 becomes smaller in both end portions in the stacked direction than in the middle portion in the stacked direction.

First, a powder of lead titanate zirconate (PZT), a binder made of an organic polymer such as acrylic or butyral resin and a plasticizer such as DBP (dibutyl phthalate) or DOP (dioctyl phthalate) are mixed to form a slurry. The slurry is formed into a ceramic green sheet by a doctor blade method or calender roll method, or other tape molding method. Then a metallic paste for forming the internal electrode layers 13 is prepared. The metallic paste is prepared by mixing a metal powder consisting mainly of silver-palladium with a binder and a plasticizer. The metallic paste is applied to one side of the ceramic green sheet in the shape of the internal electrode layers 13 by screen printing or the like.

Then the ceramic green sheets having the metallic paste printed thereon are stacked as shown in FIG. 1 and FIG. 2, and are dried to make a multi-layer green compact. The ceramic green sheets without the metallic paste printed thereon are stacked in plurality on sides of both ends in the stacked direction of the multi-layer green compact. The portions where the ceramic green sheets without the metallic paste are stacked in plurality become the non-opposing portions 21 after being fired. The multi-layer green compact may be cut into a desired form as required. The multi-layer green compact is then heated to a predetermined temperature to remove the binder, before being fired at a temperature from 900 to 1,150° C., thereby to obtain the multi-layer structure 15.

Figure 3:
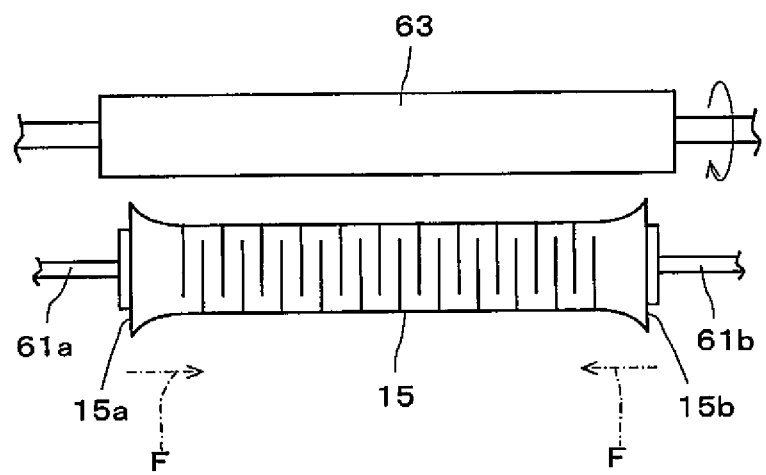
FIG. 3 is a schematic diagram showing a polishing step of a green compact according to one embodiment of the present invention.

The multi-layer structure 15 is then polished on the side faces thereof. FIG. 3 is a schematic diagram showing the polishing step. As shown in FIG. 3, the multi-layer structure 15 is held on both end faces 15a, 15b thereof by holding fixtures 61a, 61b. The multi-layer structure 15 is subjected to a pressure acting on both end faces 15a, 15b toward the center of the multi-layer structure 15. The clamping pressure F is set to a level high enough to cause the cross sectional area of the multi-layer structure 15 on both end portions (the portions that form the non-opposing portions 21) to expand in the direction perpendicular to the stacked direction.

In such a state that the cross sectional area of the multi-layer structure 15 on sides of both ends has expanded, a polishing grinder 63 is put into contact with one of the side faces of the multi-layer structure 15 to polish the surface. When polishing of one side has been completed, the multi-layer structure 15 is turned by 90 degrees and the adjoining side face is polished. This operation is repeated for all side faces. Thus the multi-layer structure 15 where the area of the cross section is smaller on sides of both ends in the stacked direction than that in the middle portion in the stacked direction.

In case the multi-layer structure 15 has Vickers hardness Hv in a range from 20 to 50 GPa on the end face thereof, it is preferable to hold the multi-layer structure 15 with a clamping pressure F of 10 MPa or more and 100 MPa or less. It is preferable that holding surfaces of the holding fixtures 65a, 65b have Vickers hardness Hv in a range from 1 to 20 GPa. When the clamping pressure F is 10 MPa or more, the cross sectional area of the multi-layer structure 15 on sides of both ends expands effectively. When the clamping pressure F is 100 MPa or less, the multi-layer structure 15 can be suppressed from deforming excessively. The cross sectional area of the multi-layer structure 15 on sides of both ends thereof can be adjusted by controlling the clamping pressure F. Shape of the multi-layer structure on both end portions can be changed by changing the clamping pressure F during polishing of the side faces so as to change the extent of expansion of the cross sectional area.

Figure 4:
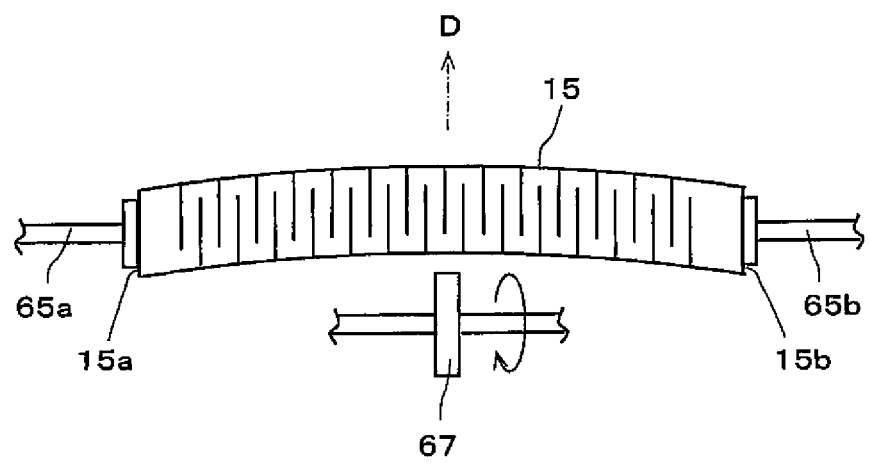
FIG. 4 is a schematic diagram showing a polishing step of a green compact according to another embodiment of the present invention.

FIG. 4 is a schematic diagram showing a polishing step of the method according to another embodiment of the present invention. As shown in FIG. 4, the multi-layer structure 15 is respectively held on both end faces 15a, 15b thereof by the holding fixtures 65a, 65b. At this time, the multi-layer structure 15 is held in such a state as the middle portion in the stacked direction projects toward one direction (the direction indicated by the symbol D, away from the polishing grinder 67 in the diagram) with respect to the both end portions in the stacked direction. As the multi-layer structure is held in this way, depth of polishing on the side faces of the multi-layer structure 15 varies with the position.

With the multi-layer structure 15 held in such a state as the middle portion in the stacked direction projects in the direction D, a polishing grinder 67 is put into contact with one of the side faces of the multi-layer structure 15 to polish the surface. When polishing of one side has been completed, the multi-layer structure 15 is turned by 90 degrees and the adjoining side face is polished in the same manner. This operation is repeated for all side faces. Thus the multi-layer structure 15 where the cross sectional area is smaller in both end portions in the stacked direction than that in the middle portion in the stacked direction.

Then the external electrodes 17 are formed on the side face of the multi-layer structure 15. The external electrodes 17 are formed from a metallic paste that is prepared by mixing a metal powder consisting mainly of silver with a binder, a plasticizer, glass powder and the like, by applying the metallic paste to the side face of the multi-layer structure by screen printing and firing at a temperature from 600 to 800° C.

Furthermore, an electrical conductivity assisting member may be formed from an electrically conductive adhesive, including a metal mesh or a mesh-like metal sheet embedded therein, and provided on the external surface of the external electrode 17. The metal mesh refers to a structure of entwined metal wires, and the mesh-like metal sheet refers to a metal sheet with a number of holes punched therethrough.

Then with lead wires connected to the external electrodes 17 by soldering or the like, the side faces of the multi-layer structure including the external electrodes 17 are coated with a covering resin such as silicone rubber by a technique such as dipping or the like, thereby to obtain the multi-layer piezoelectric element.

<Injection Apparatus>

Figure 5:
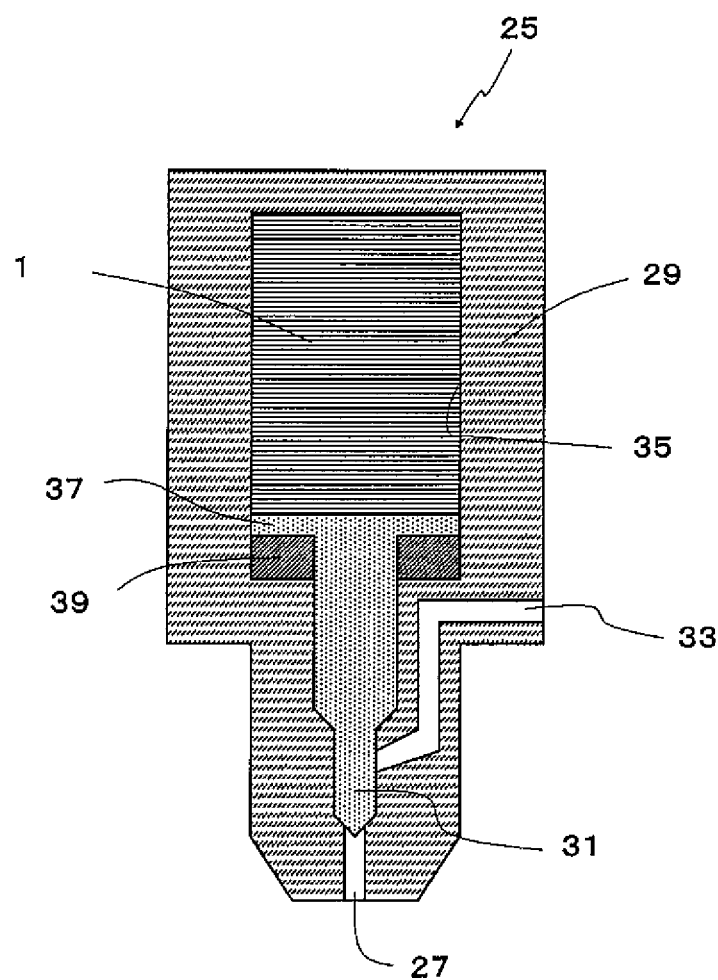
FIG. 5 is a schematic diagram showing an injection apparatus according to one embodiment of the present invention.

FIG. 5 is a schematic diagram showing an injection apparatus according to one embodiment of the present invention. As shown in FIG. 5, the injection apparatus 25 of this embodiment has the multi-layer piezoelectric element 1 of the present invention represented by the embodiment described above accommodated in a container 29 that has an injection orifice 27 formed at one end thereof. The container 29 includes a needle valve 37 that can open and close the injection orifice 27 disposed therein. Connected to the injection orifice 27 is a fuel passage 33 that is capable of communicating therewith in response to the action of the needle valve 37. The fuel passage 33 is connected to a fuel source provided on the outside, so that a fuel is supplied through the fuel passage 33 at a constant pressure that is always high. Accordingly, when the needle valve 37 opens the injection orifice 27, the fuel supplied to the fuel passage 33 is injected at a high constant pressure into a fuel chamber of an internal combustion engine which is not shown.

The needle valve 37 is enlarged in diameter at the upper end, and is disposed so as to be capable of sliding in a cylinder 35 that is formed in the container 29. A piezoelectric actuator having the multi-layer piezoelectric element 1 described above is accommodated in the container 29.

With the injection apparatus as described above, when the piezoelectric actuator is caused to expand by applying a voltage thereto, the upper end of the needle valve 37 is pressed so that the needle valve 37 plugs the injection orifice 27 and shuts off the fuel supply. When the voltage is removed, the piezoelectric actuator contracts and a Belleville spring 39 presses back the upper end of the needle valve 37 so that the injection orifice 27 communicates with the fuel passage 33 thereby allowing the fuel to be ejected.

The injection apparatus 25 of the present invention may also be constituted from a container that has the injection orifice 27 and the multi-layer piezoelectric element 1 described above, so that a liquid that fills the container is discharged through the injection orifice 27 by the operation of the multi-layer piezoelectric element 1. That is, the multi-layer piezoelectric element 1 may not necessarily be in the inside of the container. The only requirement is that a pressure can be applied to the inside of the container by the operation of the multi-layer piezoelectric element 1. In the present invention, the liquid may be a fuel, ink or various other fluid (such as electrically conductive paste).

<Fuel Injection System>

Figure 6:
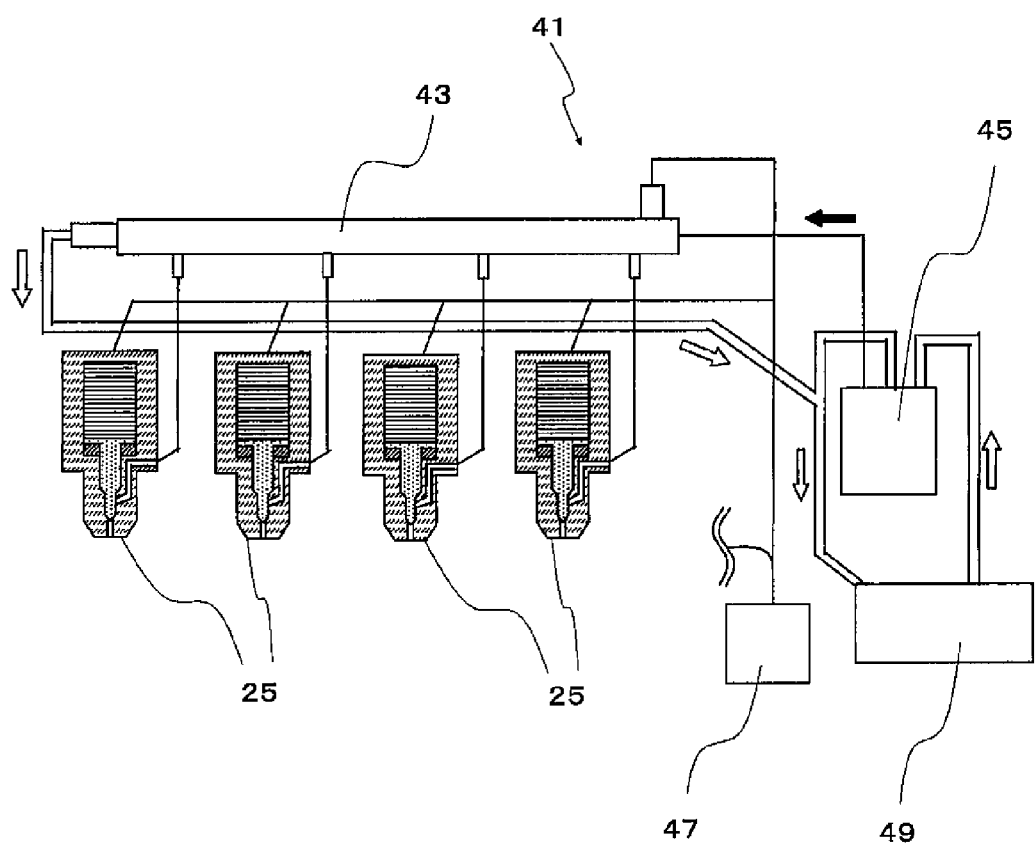
FIG. 6 is a schematic diagram showing a fuel injection system according to one embodiment of the present invention.

FIG. 6 is a schematic diagram showing a fuel injection system according to one embodiment of the present invention. As shown in FIG. 6, the fuel injection system 41 of this embodiment comprises a common rail 43 that stores a high-pressure fuel, a plurality of the injection apparatuses 25 that eject the fuel stored in the common rail 43, a pump 45 that supplies the fuel at a high pressure to the common rail 43 and an injection control unit 47 that sends a drive signal to the injection apparatuses 25.

The injection control unit 47 controls the quantity and timing of fuel injection while monitoring the condition in the combustion chamber of an engine with sensors and the like. The pump 45 delivers the fuel from the fuel tank 49 to the common rail 43 by boosting the pressure to a level in a range from 1000 to 2,000 atm (from about 101 MPa to about 203 MPa), preferably from 1,500 to 1,700 atm (from about 152 MPa to about 172 MPa). The common rail 43 stores the fuel that has been supplied by the pump 45, and sends it to the injection apparatuses 25 as required. The injection apparatus 25 injects a small amount of the fuel through the injection orifice 27 in the form of mist into the combustion chamber.

While the embodiments of the present invention have been described, the present invention is not limited to the embodiment described above. The non-opposing portions 21 in the present invention are a portion where the internal electrode layers 13, that contribute to the displacement when a voltage is applied, are not provided to oppose each other, namely the portion that does not undergo displacement. Accordingly, the non-opposing portions may include metal layer or the like.

In the polishing step shown in FIG. 3 and FIG. 4, instead of turning the multi-layer structure 15 by 90 degrees and polishing the adjoining side face, the multi-layer structure 15 may be turned by 180 degrees to polish the opposing side face, followed by turning the multi-layer structure 15 by 90 degrees and polishing the adjoining side face and turning the multi-layer structure 15 by 180 degrees to polish the opposing side face.

The invention claimed is:

1. A multi-layer piezoelectric element, comprising:
a multi-layer structure comprising a plurality of internal electrode layers and a plurality of piezoelectric material layers, the plurality of piezoelectric material layers being stacked with each one of the plurality of internal electrode layers intervened between each two of the plurality of piezoelectric material layers,
wherein a cross-sectional area of a cross section of the multi-layer structure parallel to the plurality of internal electrode layers is smaller in both end portions in a stacked direction than in a middle portion in the stacked direction,
wherein the multi-layer structure comprises
a sectional area reducing portion where the cross-sectional area becomes smaller toward both ends in the stacked direction,
an opposing portion where the plurality of internal electrode layers oppose each other, and non-opposing portions positioned on sides of both ends of the opposing portion in the stacked direction, and
wherein the sectional area reducing portion is formed so as to extend across the opposing portion and the non-opposing portions.

2. A injection apparatus, comprising:
a container comprising the injection orifice; and
the multi-layer piezoelectric element according to claim 1,
wherein a liquid filling the container is discharged through the injection orifice by an operation of the multi-layer piezoelectric element.

3. A fuel injection system, comprising:
a common rail configured to store a high-pressure fuel;
the injection apparatus according to claim 2 configured to eject the high-pressure fuel stored in the common rail;
a pump configured to supply the high-pressure fuel at a high pressure to the common rail; and
an injection control unit configured to send a drive signal to the injection apparatus.

4. A method of manufacturing a multi-layer piezoelectric element, the multi-layer piezoelectric element comprising a multi-layer structure comprising a plurality of internal electrode layers and a plurality of piezoelectric material layers, the plurality of piezoelectric material layers being stacked with each one of the plurality of internal electrode layers intervened between each two of the plurality of piezoelectric material layers, the method comprising:
polishing a side face of the multi-layer structure so that a cross-sectional area of the cross section of the multi-layer structure parallel to the plurality of internal electrode layers is smaller in both end portions in a stacked direction than in a middle portion in the stacked direction,
wherein the side face of the multi-layer structure is polished in a state that the multi-layer structure is put pressure on both end faces in the stacked direction toward the middle portion.

5. The method according to claim 4, wherein the side face of the multi-layer structure is polished in a state that the middle portion in the stacked direction is projected toward one direction with respect to the both end portions in the stacked direction.

* * * * *